(12) United States Patent
Peng et al.

(10) Patent No.: US 7,829,397 B2
(45) Date of Patent: Nov. 9, 2010

(54) BOTTOM-GATE THIN FILM TRANSISTOR AND METHOD OF FABRICATING THE SAME

(75) Inventors: Ya-Hui Peng, Hsin-Chu (TW); Yi-Ya Tseng, Hsin-Chu (TW); Kun-Fu Huang, Hsin-Chu (TW); Chih-Hsien Chen, Hsin-Chu (TW); Han-Tu Lin, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/400,171

(22) Filed: Mar. 9, 2009

(65) Prior Publication Data

US 2010/0096630 A1    Apr. 22, 2010

(30) Foreign Application Priority Data

Oct. 22, 2008    (TW) ............... 97140539 A

(51) Int. Cl.
*H01L 21/00* (2006.01)
*H01L 21/84* (2006.01)
*H01L 21/8238* (2006.01)

(52) U.S. Cl. .................. 438/149; 438/153; 438/199; 438/151

(58) Field of Classification Search .......... 438/488, 438/149, 153, 26, 30, 151, 199, 165
See application file for complete search history.

(56) References Cited

U.S. PATENT DOCUMENTS 3,874,919 A * 4/1975 Lehman ............... 438/439
5,888,855 A   3/1999 Nagahisa et al.
6,890,803 B2  5/2005 Lin et al.
2002/0117719 A1  8/2002 Ando et al.
2006/0240602 A1 10/2006 Cabarrocas et al.
2009/0137087 A1* 5/2009 Yamazaki et al. ........... 438/158

FOREIGN PATENT DOCUMENTS

| JP | H05-283693 | 10/1993 |
| JP | H08-228011 | 9/1996 |
| JP | H08-321618 | 12/1996 |

OTHER PUBLICATIONS

English language translation of abstract of H05-283693.
English language translation of abstract of H08-228011.
English language translation of abstract of H08-321618.

* cited by examiner

*Primary Examiner*—Chuog A. Luu
(74) *Attorney, Agent, or Firm*—Thomas, Kayden, Horstemeyer & Risley, LLP

(57) ABSTRACT

A bottom-gate thin film transistor includes a gate electrode, a gate insulating layer and a microcrystalline silicon layer. The gate electrode is disposed on a substrate. The gate insulating layer is made up of silicon nitride and disposed on the gate electrode and the substrate. The microcrystalline silicon layer is disposed on the gate insulating layer and corresponds to the gate electrode, in which a contact interface between the gate insulating layer and the microcrystalline silicon layer has a plurality of oxygen atoms, and concentration of the oxygen atoms ranges between $10^{20}$ atoms/cm$^3$ and $10^{25}$ atoms/cm$^3$. A method of fabricating a bottom-gate thin film transistor is also disclosed herein.

13 Claims, 5 Drawing Sheets

BOTTOM-GATE THIN FILM TRANSISTOR AND METHOD OF FABRICATING THE SAME

RELATED APPLICATIONS

This application claims priority to Taiwan Patent Application Serial Number 97140539, filed Oct. 22, 2008, which is herein incorporated by reference.

BACKGROUND

1. Field of Invention

The present invention relates to a thin film transistor and method of fabricating the same. More particularly, the present invention relates to a bottom-gate thin film transistor and method of fabricating the same.

2. Description of Related Art

In a conventional fabrication process of a bottom-gate thin film transistor (TFT), a microcrystalline silicon film is often formed on a gate insulating layer which is usually made up of silicon nitride, so as to solve the problem that the gate threshold voltage shifts and thus causes the display panel to have asymmetric brightness. However, since the characteristics of the microcrystalline silicon film and the gate insulating layer are so different from each other, the thin film interface between them has poor quality and easily becomes porous film or amorphous silicon film.

Specifically, when plasma enhanced chemical vapor deposition (PECVD) is employed to form the microcrystalline silicon film, the microcrystalline silicon film easily peels off because the microcrystalline silicon film and the silicon nitride film have a low level of adhesion therebetween. Moreover, the interface between the microcrystalline silicon film and the silicon nitride film does not has good crystallinity, so the overall microcrystalline silicon film accordingly will have poor crystallinity as well such that the characteristics of the thin film transistor deteriorate.

SUMMARY

In accordance with one embodiment of the present invention, a bottom-gate thin film transistor is provided. The bottom-gate thin film transistor includes a gate electrode, a gate insulating layer and a microcrystalline silicon layer. The gate electrode is disposed on a substrate. The gate insulating layer is made up of silicon nitride and disposed on the gate electrode and the substrate. The microcrystalline silicon layer is disposed on the gate insulating layer and corresponds to the gate electrode, in which a contact interface between the gate insulating layer and the microcrystalline silicon layer has a plurality of oxygen atoms, and concentration of the oxygen atoms ranges between $10^{20}$ atoms/cm$^3$ and $10^{25}$ atoms/cm$^3$.

In accordance with another embodiment of the present invention, a method of fabricating a bottom-gate thin film transistor is provided. The method includes the steps of: forming a gate electrode on a substrate; forming a silicon nitride layer on the gate electrode and the substrate; performing an oxygenation surface treatment for a surface of the silicon nitride layer; and forming a microcrystalline silicon layer on the silicon nitride layer, wherein the step of performing the oxygenation surface treatment for the surface of the silicon nitride layer enables oxygen concentration of a contact interface between the silicon nitride layer and the microcrystalline silicon layer to range between $10^{20}$ atoms/cm$^3$ and $10^{25}$ atoms/cm$^3$.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference to the accompanying drawings as follows.

DESCRIPTION OF THE PREFERRED EMBODIMENTS

In the following detailed description, the embodiments of the present invention have been shown and described. As will be realized, the invention is capable of modification in various respects, all without departing from the invention. Accordingly, the drawings and description are to be regarded as illustrative in nature, and not restrictive by the present invention.

Figure 1A:
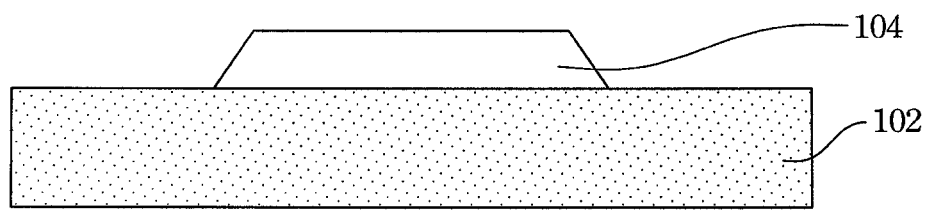
FIGS. 1A to 1G illustrate the fabrication process of a bottom-gate thin film transistor according to one embodiment of the present invention.
Figure 1B:
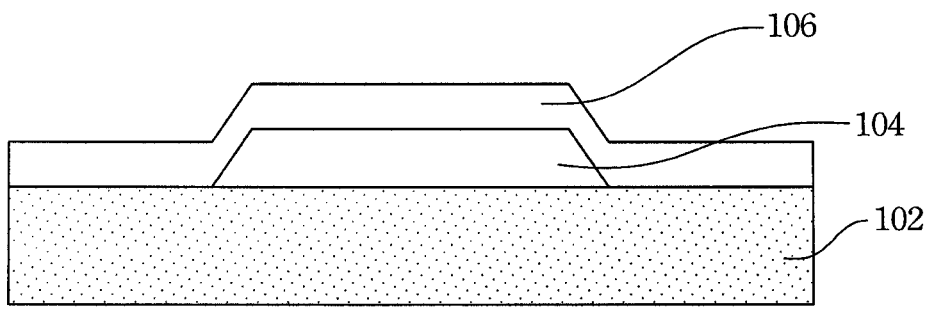
Figure 1C:
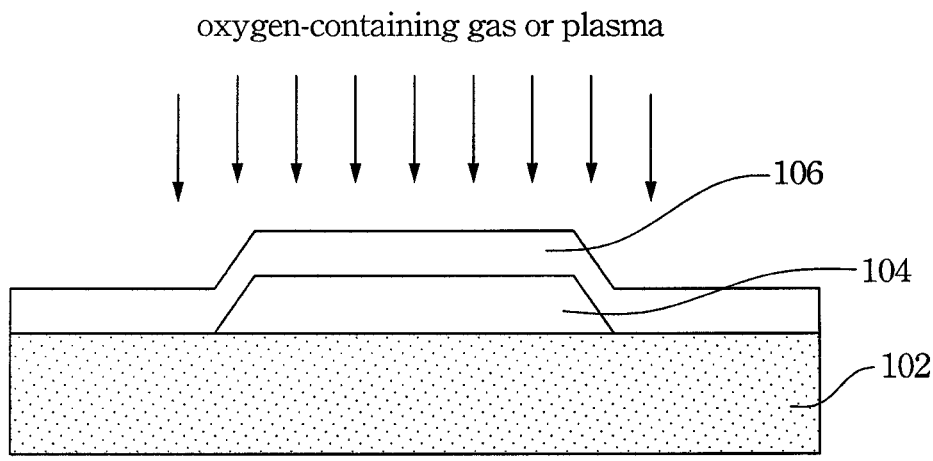
Figure 1D:
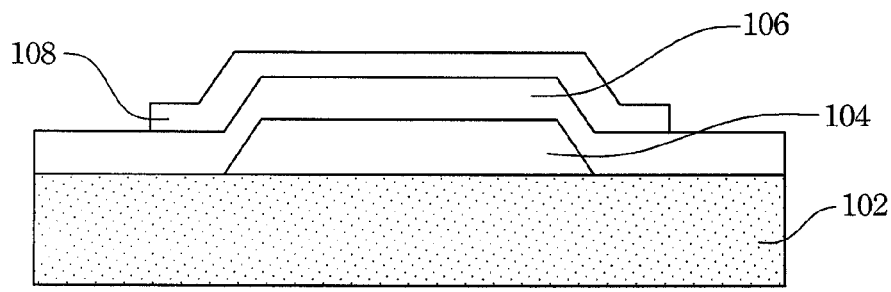

FIGS. 1A to 1G illustrate the fabrication process of a bottom-gate thin film transistor according to one embodiment of the present invention. First, a gate electrode 104 is formed on a substrate 102, as shown in FIG. 1A. Then, a gate insulating layer is formed on the gate electrode 104 and the substrate 102, in which the gate insulating layer can be a silicon nitride layer 106 preferably made up of silicon nitride (SiN$_x$), as shown in FIG. 1B. After that, an oxygenation surface treatment is performed on the surface of the silicon nitride layer 106, as shown in FIG. 1C. Afterwards, a microcrystalline silicon (μc-Si) layer 108 is formed on the silicon nitride layer 106 as a channel layer, as shown in FIG. 1D. Notably, the step of forming the silicon nitride layer 106 can be performed by plasma enhanced chemical vapor deposition (PECVD), and the step of forming the microcrystalline silicon layer 108 can be performed by PECVD with hydrogen and silane (SiH$_4$) precursor gases, having a hydrogen-to-silane ratio (H$_2$/SiH$_4$) ranging between 80 and 200, especially between 80 and 140.

The foregoing oxygenation surface treatment can be performed on the surface of the silicon nitride layer 106 with oxygen-containing gas or oxygen-containing plasma, such that a contact interface between the silicon nitride layer 106 and the microcrystalline silicon layer 108 has a plurality of oxygen atoms and the concentration of the oxygen atoms, measured by Second Ion Mass Spectrometry (SIMS), ranges between $10^{20}$ atoms/cm$^3$ and $10^{25}$ atoms/cm$^3$. Furthermore, the microcrystalline silicon layer 108, formed after the oxygenation surface treatment, may include other kinds of atoms such as silicon (Si), boron (B), phosphorus (P) and hydrogen (H).

When the surface of the silicon nitride layer 106 is performed by the oxygenation surface treatment with the oxygen-containing gas, the oxygen-containing gas is selected from the group consisting of nitric oxide (NO), nitrous oxide ($N_2O$), nitrogen dioxide ($NO_2$), hydrogen peroxide ($H_2O_2$), oxygen ($O_2$) and ozone ($O_3$). Heating or decomposing oxygen-containing compounds also can produce the oxygen-containing gas. Where the oxygen-containing gas comes from or how to obtain the oxygen-containing gas is not restrictive by the present invention. The duration of the oxygenation surface treatment performed on the surface of the silicon nitride layer 106 can range between 9 seconds and 5.5 hours.

On the other hand, when the surface of the silicon nitride layer 106 is performed by the oxygenation surface treatment with the oxygen-containing plasma, the oxygen-containing plasma is selected from the group consisting of nitric oxide (NO) plasma, nitrous oxide ($N_2O$) plasma, nitrogen dioxide ($NO_2$) plasma, hydrogen peroxide ($H_2O_2$) plasma, oxygen ($O_2$) plasma and ozone ($O_3$) plasma. Heating or decomposing oxygen-containing compounds also can produce the oxygen-containing plasma. Where the oxygen-containing plasma comes from or how to obtain the oxygen-containing plasma is not restrictive by the present invention. The duration of the oxygenation surface treatment performed on the surface of the silicon nitride layer 106 can range between 9 seconds and 132 seconds. Notably, the aforementioned duration of the oxygenation surface treatment is related to the oxygen concentration and not directly related to the types of the oxygen-containing gas or oxygen-containing plasma. The types of the oxygen-containing gas or oxygen-containing plasma do not affect the crystallinity, either.

In addition, the step of forming the microcrystalline silicon layer 108 can be carried out by an in-situ manner on the silicon nitride layer 106; that is, the silicon nitride layer 106 and the microcrystalline silicon layer 108 are continuously formed without changing the films growing environment. On the other hand, the step of forming the microcrystalline silicon layer 108 can also be carried out by an ex-situ manner on the silicon nitride layer 106; for example, after the silicon nitride layer 106 is formed, the sample is taken out from the films growing environment and placed in the air and then the microcrystalline silicon layer 108 is formed thereon.

Moreover, when the microcrystalline silicon layer 108 is formed, its forming temperature can range between 200° C. and 380° C., especially between 250° C. and 300° C., such that the crystallinity of the microcrystalline silicon layer 108 ranges between 20% and 60% (or even higher), the thickness of the microcrystalline silicon layer 108 ranges between 50 angstrom (Å) and 1500 angstrom (Å), and the concentration of the silicon atoms in the microcrystalline silicon layer 108, measured by Second Ion Mass Spectrometry (SIMS), ranges between $10^{21}$ atoms/cm$^3$ and $10^{25}$ atoms/cm$^3$.

Figure 1E:
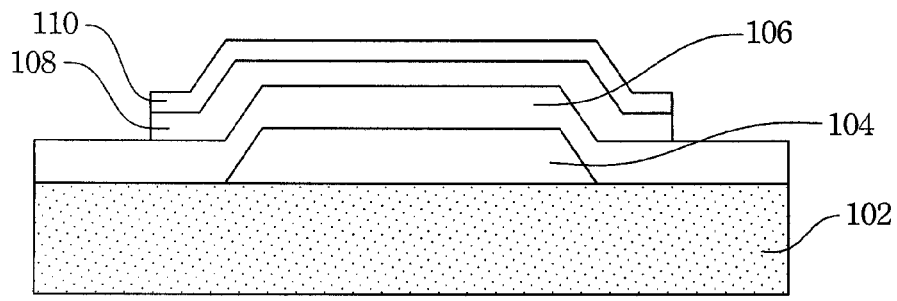
Figure 1F:
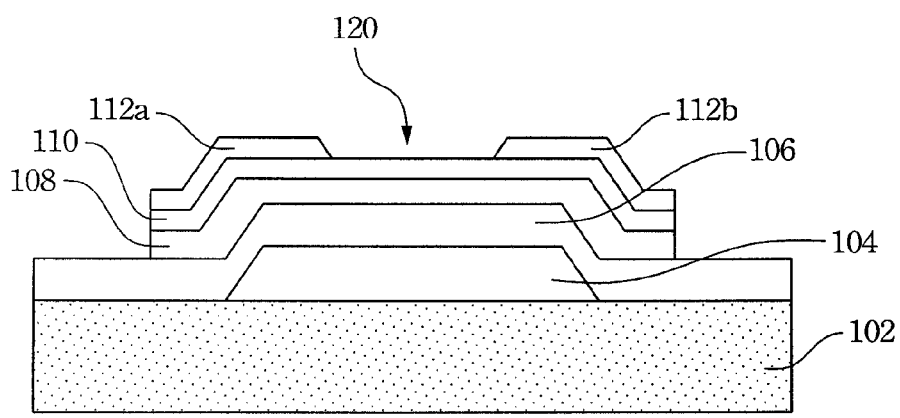
Figure 1G:
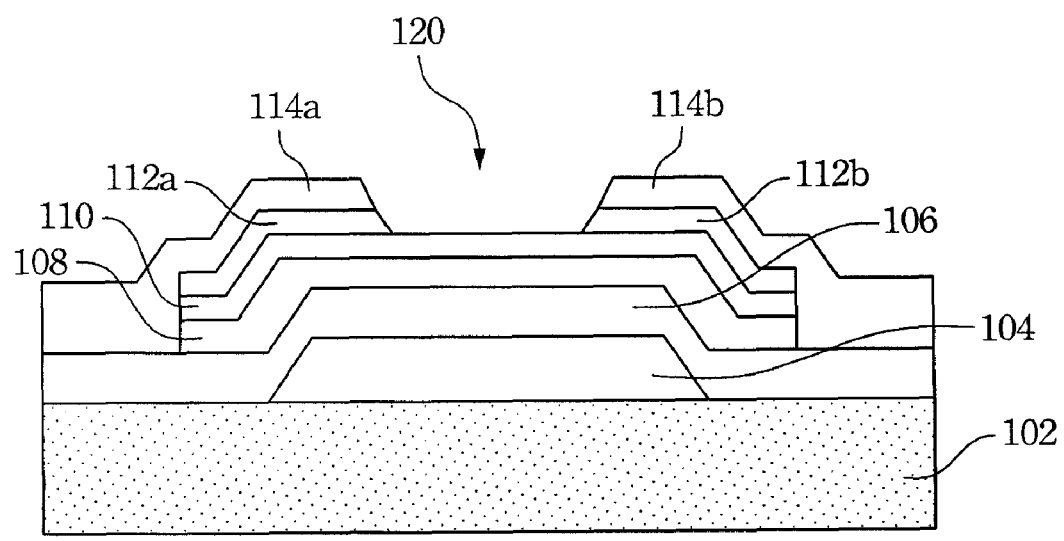

After the microcrystalline silicon layer 108 is formed on the silicon nitride layer 106, an amorphous silicon (α-Si) layer 110 is then formed on the microcrystalline silicon layer 108, as shown in FIG. 1E. After that, a drain region 112a and a source region 112b made up of n-type amorphous silicon or n-type microcrystalline silicon are formed on the amorphous silicon layer 110, in which the drain region 112a and the source region 112b have a gap 120 therebetween, corresponding to the gate electrode 104, as shown in FIG. 1F. Afterwards, a drain electrode 114a and a source electrode 114b are respectively formed on the drain region 112a and the source region 112b, and the fabrication of the bottom-gate TFT is thus completed, as shown in FIG. 1G.

In specific examples of fabrication conditions, when forming the microcrystalline silicon layer, and the oxygen concentration and crystal fraction of the interface between the microcrystalline silicon layer and the silicon nitride layer are described as follows. The following table 1 shows different examples of forming different films and performing different surface treatments when fabricating the bottom-gate TFT.

TABLE 1

| Sample | crystallinity (%) | oxygen concentration (atoms/cm$^3$) |
|---|---|---|
| Comparison 1 | 0 | $5.00 \times 10^{18}$ |
| Comparison 2 | 16 | $4.00 \times 10^{19}$ |
| Embodiment 1 | 53 | $4.00 \times 10^{21}$ |
| Embodiment 2 | 53 | $1.00 \times 10^{22}$ |
| Embodiment 3 | 52 | $1.00 \times 10^{21}$ |
| Embodiment 4 | 53 | $4.00 \times 10^{21}$ |

Comparison 1 is an example of forming the silicon nitride film and the amorphous silicon film by employing the gas containing approximate hydrogen-to-silane ratio ($H_2/SiH_4$) of 4 with an approximate forming temperature of 280° C. and continuously forming the silicon nitride film and the amorphous silicon film by RF-PECVD. As shown in Table 1, the oxygen concentration of the interface between the silicon nitride film and the amorphous silicon film is $5.00 \times 10^{18}$ and its crystallinity is 0.

Comparison 2 is an example of forming the silicon nitride film and the microcrystalline silicon film by employing the gas containing approximate hydrogen-to-silane ratio ($H_2/SiH_4$) of 130 with an approximate forming temperature of 280° C. and continuously forming the silicon nitride film and the microcrystalline silicon film by RF-PECVD. In the present example, the microcrystalline silicon film is immediately formed after forming the silicon nitride film, without performing the surface treatment with the oxygen-containing gas or plasma on the surface of the silicon nitride film. As shown in Table 1, the oxygen concentration of the interface between the silicon nitride film and the microcrystalline silicon film is $4.00 \times 10^{19}$ and its crystallinity is 16%.

Embodiment 1 is an example of forming the silicon nitride film and the microcrystalline silicon film by employing the gas containing approximate hydrogen-to-silane ratio ($H_2/SiH_4$) of 130 with an approximate forming temperature of 280° C. and continuously forming the silicon nitride film and the microcrystalline silicon film by RF-PECVD. In the present example, the microcrystalline silicon film is formed after forming the silicon nitride film, with performing the surface treatment with the oxygen-containing plasma on the surface of the silicon nitride film for 10 seconds. As shown in Table 1, the oxygen concentration of the interface between the silicon nitride film and the microcrystalline silicon film is $4.00 \times 10^{21}$ and its crystallinity is 53%.

Embodiment 2 is an example of forming the silicon nitride film and the microcrystalline silicon film by employing the gas containing approximate hydrogen-to-silane ratio ($H_2/SiH_4$) of 130 with an approximate forming temperature of 280° C. and continuously forming the silicon nitride film and the microcrystalline silicon film by RF-PECVD. In the present example, the microcrystalline silicon film is formed after forming the silicon nitride film, with performing the surface treatment with the oxygen-containing plasma on the surface of the silicon nitride film for 120 seconds. As shown in Table 1, the oxygen concentration of the interface between the silicon nitride film and the microcrystalline silicon film is $1.00 \times 10^{22}$ and its crystallinity is 53%.

Embodiment 3 is an example of forming the silicon nitride film and the microcrystalline silicon film by employing the gas containing approximate hydrogen-to-silane ratio ($H_2/SiH_4$) of 130 with an approximate forming temperature of 280° C. and continuously forming the silicon nitride film and the microcrystalline silicon film by RF-PECVD. In the present example, the microcrystalline silicon film is formed after forming the silicon nitride film, with performing the surface treatment with the oxygen-containing gas on the surface of the silicon nitride film for 10 seconds. As shown in Table 1, the oxygen concentration of the interface between the silicon nitride film and the microcrystalline silicon film is $1.00 \times 10^{21}$ and its crystallinity is 52%.

Embodiment 4 is an example of forming the silicon nitride film and the microcrystalline silicon film by employing the gas containing approximate hydrogen-to-silane ratio ($H_2$/$SiH_4$) of 130 with an approximate forming temperature of 280° C. and continuously forming the silicon nitride film and the microcrystalline silicon film by RF-PECVD. In the present example, the sample is taken out and placed in the air after forming the silicon nitride film, and then the microcrystalline silicon film is formed. As shown in Table 1, the oxygen concentration of the interface between the silicon nitride film and the microcrystalline silicon film is $4.00 \times 10^{21}$ and its crystallinity is 53%. Since the oxygen concentration of the air is 20% that is lower than the oxygen concentration, which can range between 30% and 95%, in the films growing environment provided in the foregoing embodiments, the duration of the oxygenation surface treatment is related to the oxygen concentration but not the types of the oxygen-containing gas or oxygen-containing plasma. Also, the types of the oxygen-containing gas or oxygen-containing plasma will not affect the crystallinity.

In accordance with the results of the aforementioned Comparison 1-2 and Embodiment 1-4, the oxygen concentration and the crystallinity of the interface between the silicon nitride film and the microcrystalline silicon film both are higher than those of the interface between the silicon nitride film and the amorphous silicon film. Furthermore, after the silicon nitride film is formed, performing the surface treatment, with oxygen-containing gas or plasma, for the surface of the silicon nitride film such that the oxygen concentration thereof is increased, can substantially increase the crystallinity of the interface between the silicon nitride film and the microcrystalline silicon film.

Figure 2:
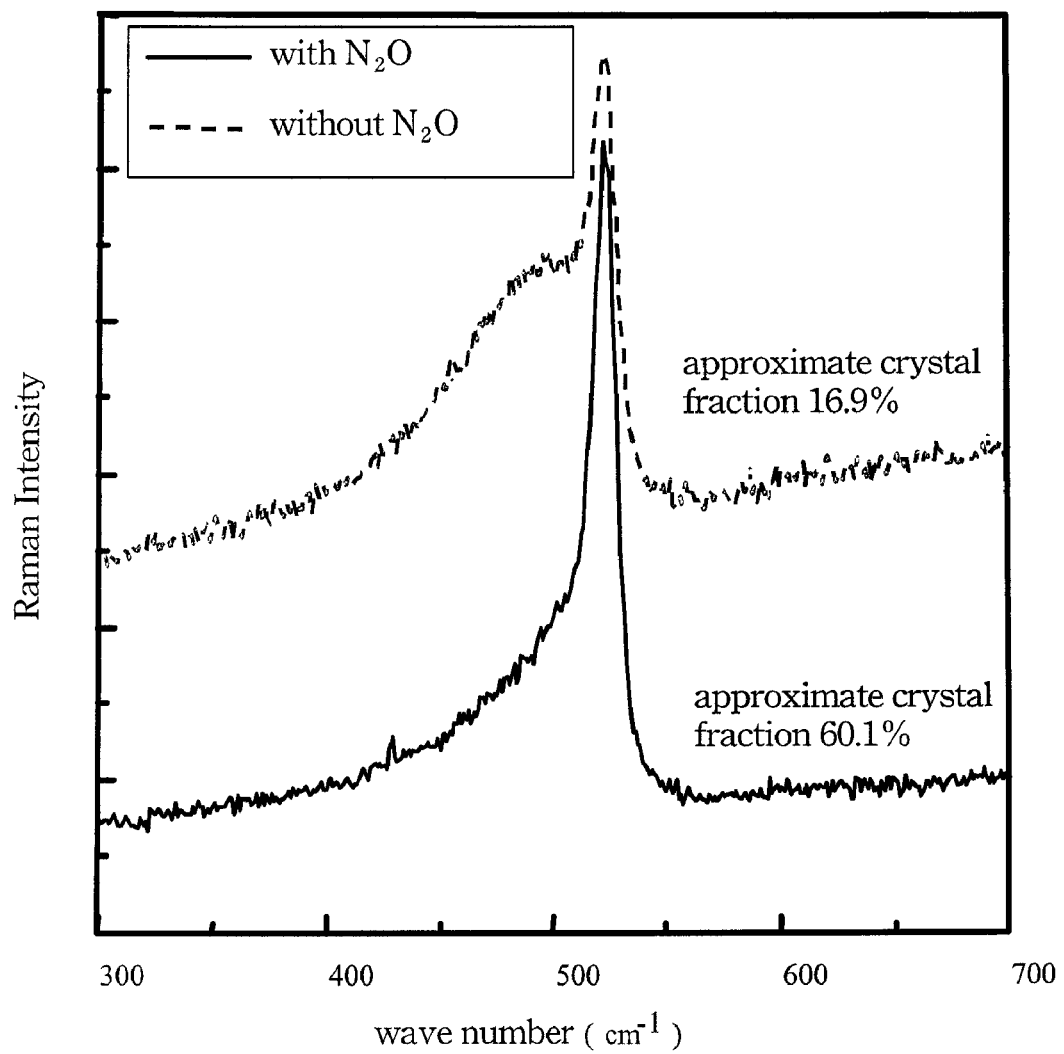
FIG. 2 illustrates Raman spectrum of the sample with surface treatment, according to one embodiment of the present invention, compared to the conventional sample without surface treatment.

FIG. 2 illustrates Raman spectrum of the sample with surface treatment, according to one embodiment of the present invention, compared to the conventional sample without surface treatment. As shown in FIG. 2, the horizontal axis notes wave number ($cm^{-1}$) (i.e. the reciprocal of the frequency/light-speed or wavelength), and the vertical axis notes non-dimensional Raman intensity. Conventionally, within the particular wave number range, if the slope of the curve of Raman intensity changes more rapidly, the width of the area formed by the curve is narrower and the corresponding crystallinity is higher. The precise value of the crystallinity, however, must be calculated by using formulas and is not discussed in the present invention.

Therefore, as apparently shown in FIG. 2, after the surface of the silicon nitride film is treated by the surface treatment with $N_2O$, the crystallinity, corresponding to the wave number of nearly 520 $cm^{-1}$, is obviously increased from 16.9% to 60.1%. As a result, it is helpful for the formation of the microcrystalline silicon film and the quality of the microcrystalline silicon film can thus be improved.

Figure 3:
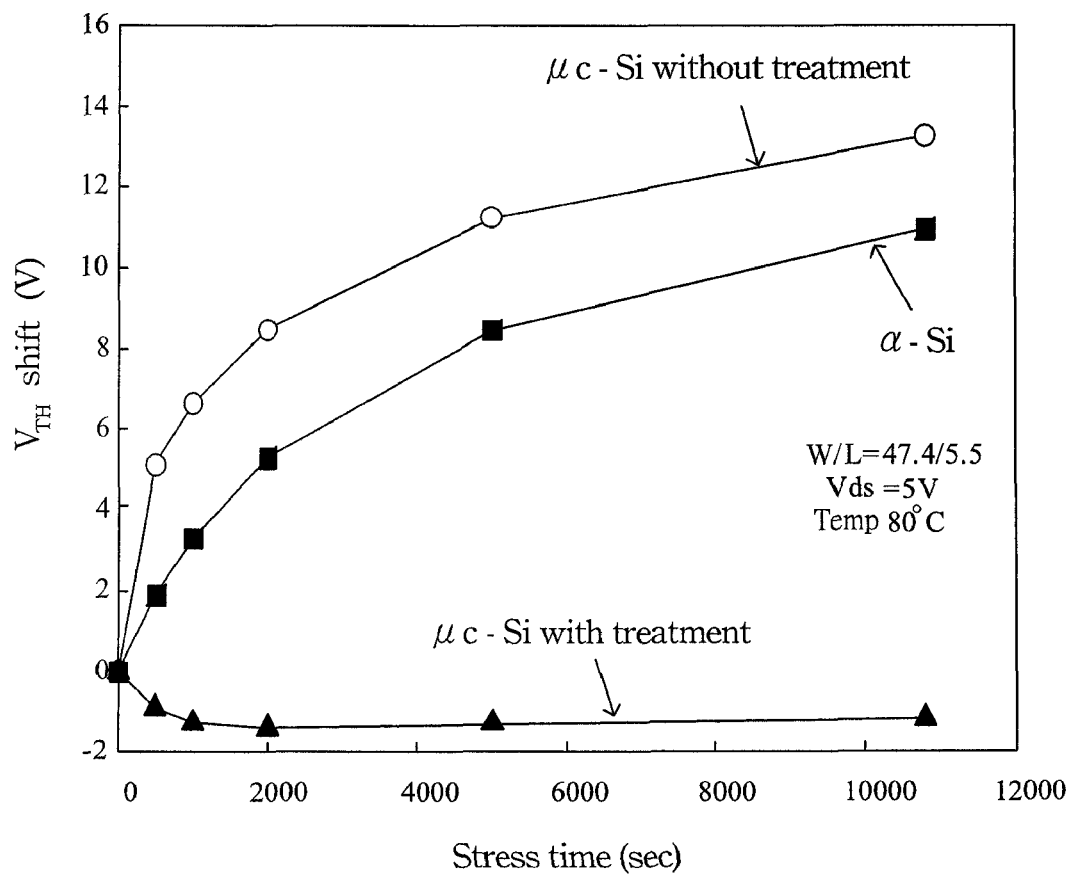
FIG. 3 illustrates a diagram of the bias-temperature-stress test result of the bottom-gate TFT with surface treatment, according to one embodiment of the present invention, compared to the conventional bottom-gate TFT without surface treatment.

FIG. 3 illustrates a diagram of bias-temperature-stress result of the bottom-gate TFT with surface treatment, according to one embodiment of the present invention, compared to the conventional bottom-gate TFT without surface treatment. As shown in FIG. 3, the horizontal axis notes stress time or duration (sec), and the vertical axis notes the shifts of threshold voltage (V). The curve formed by connecting the symbol ○ represents the threshold voltage shift curve of the bottom-gate TFT having the microcrystalline silicon film without surface treatment. The curve formed by connecting the symbol ■ represents the threshold voltage shift curve of the bottom-gate TFT having the amorphous silicon film without surface treatment. The curve formed by connecting the symbol ▲ represents the threshold voltage shift curve of the bottom-gate TFT having the microcrystalline silicon film with surface treatment.

According to FIG. 3, the bottom-gate TFT having the microcrystalline silicon film with surface treatment has a lower threshold voltage shift, which ranges between 0V and −2V, than the bottom-gate TFT merely having the amorphous silicon film or the bottom-gate TFT having the microcrystalline silicon film without surface treatment. As a result, the stability of the bottom-gate TFT can be increased and the characteristics thereof can thus be substantially improved.

For the foregoing embodiments, the bottom-gate TFT and the method of fabricating the same can be provided such that not only the crystallinity of the microcrystalline silicon film therein is increased for helpfully forming the microcrystalline silicon film, but also the quality of the microcrystalline silicon film can thus be improved to further enhance the characteristics of the bottom-gate TFT.

As is understood by a person skilled in the art, the foregoing embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. A method of fabricating a bottom-gate thin film transistor, comprising:
    forming a gate electrode on a substrate;
    forming a silicon nitride layer on the gate electrode and the substrate;
    performing an oxygenation surface treatment on a surface of the silicon nitride layer; and
    forming a microcrystalline silicon layer on the silicon nitride layer subjected to the oxygenation surface treatment, wherein the step of performing the oxygenation surface treatment on the surface of the silicon nitride layer enables oxygen concentration of a contact interface between the silicon nitride layer and the microcrystalline silicon layer to range between $10^{20}$ atoms/$cm^3$ and $10^{25}$ atoms/$cm^3$.

2. The method of claim 1, wherein the oxygenation surface treatment is performed on the surface of the silicon nitride layer with oxygen-containing gas.

3. The method of claim 2, wherein the oxygen-containing gas is selected from the group consisting of nitric oxide (NO), nitrous oxide ($N_2O$), nitrogen dioxide ($NO_2$), hydrogen peroxide ($H_2O_2$), oxygen ($O_2$) and ozone ($O_3$).

4. The method of claim 2, wherein duration of the oxygenation surface treatment performed on the surface of the silicon nitride layer ranges between 9 seconds and 5.5 hours.

5. The method of claim 1, wherein the oxygenation surface treatment is performed on the surface of the silicon nitride layer with oxygen-containing plasma.

6. The method of claim 5, wherein the oxygen-containing plasma is selected from the group consisting of nitric oxide (NO) plasma, nitrous oxide ($N_2O$) plasma, nitrogen dioxide ($NO_2$) plasma, hydrogen peroxide ($H_2O_2$) plasma, oxygen ($O_2$) plasma and ozone ($O_3$) plasma.

7. The method of claim 5, wherein duration of the oxygenation surface treatment performed on the surface of the silicon nitride layer with the oxygen-containing plasma ranges between 9 seconds and 132 seconds.

8. The method of claim 1, wherein the step of forming the microcrystalline silicon layer on the silicon nitride layer is carried out by an in-situ manner.

9. The method of claim 1, wherein the step of forming the microcrystalline silicon layer on the silicon nitride layer is carried out by an ex-situ manner.

10. The method of claim 1, wherein the step of forming the microcrystalline silicon layer further comprises:

providing hydrogen and silane precursor gases, wherein ratio of the hydrogen to the silane ranges between 80 and 200.

11. The method of claim 1, wherein the silicon nitride layer is formed by plasma enhanced chemical vapor deposition (PECVD).

12. The method of claim 1, wherein the microcrystalline silicon layer is formed by plasma enhanced chemical vapor deposition (PECVD).

13. The method of claim 1, wherein forming temperature of the microcrystalline silicon layer ranges between 200° C. and 380° C.

* * * * *